(12) United States Patent
Vogt

(10) Patent No.: US 6,861,206 B2
(45) Date of Patent: Mar. 1, 2005

(54) METHOD FOR PRODUCING A STRUCTURED LAYER ON A SEMICONDUCTOR SUBSTRATE

(75) Inventor: Mirko Vogt, Dresden (DE)

(73) Assignee: Infineon Technologies AG, Munich (DE)

( * ) Notice: Subject to any disclaimer, the term of this patent is extended or adjusted under 35 U.S.C. 154(b) by 186 days.

(21) Appl. No.: 10/233,692

(22) Filed: Sep. 3, 2002

(65) Prior Publication Data

US 2003/0049568 A1 Mar. 13, 2003

(30) Foreign Application Priority Data

Aug. 31, 2001 (DE) .......................................... 101 42 683

(51) Int. Cl.⁷ ................................................. G03F 7/00
(52) U.S. Cl. ........................ 430/313; 430/327; 430/950
(58) Field of Search ................................ 430/311, 313, 430/317, 327, 950

(56) References Cited

U.S. PATENT DOCUMENTS

2003/0186537 A1 * 10/2003 Yamanaka et al. .......... 438/637

* cited by examiner

Primary Examiner—Kathleen Duda
(74) Attorney, Agent, or Firm—Laurence A. Greenberg; Werner H. Stemer; Gregory L. Mayback

(57) ABSTRACT

A method for producing a structured layer on a semiconductor substrate includes the steps of creating the layer on the substrate, modifying a surface of the layer to form a chemically neutral surface, creating an acid-forming photoresist layer on the layer on the substrate, exposing the acid-forming photoresist layer to light for embodying an acid-containing layer in the photoresist layer in accordance with a specified structure of a photoexposure mask, and selectively removing the acid-containing region of the photoresist layer with a lye. The method further includes modifying the surface of the foundation layer for reducing degradation in structuring the acid-forming layer.

10 Claims, 4 Drawing Sheets

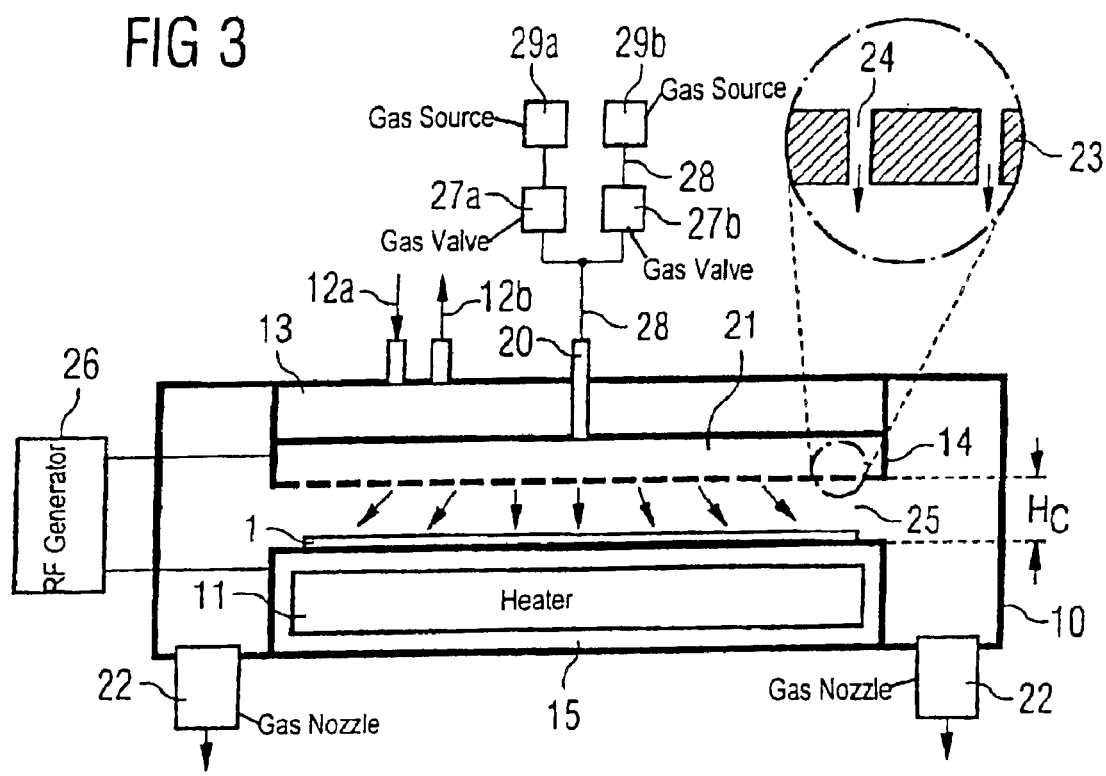

METHOD FOR PRODUCING A STRUCTURED LAYER ON A SEMICONDUCTOR SUBSTRATE

BACKGROUND OF THE INVENTION

Field of the Invention

The invention relates to a method for photolithographic structuring of layers on a semiconductor substrate.

Producing integrated circuits with very tiny structures requires special structuring methods. One of the most commonly used methods since the evolution of semiconductor technology is lithographic structuring. There, a photoresist layer is placed on the surface to be structured and is exposed to light through a photoexposure mask. In this way, structures formed beforehand on the photoexposure mask can be copied onto the photoresist layer, and then transferred with a subsequent, preferably wet-chemical etching process, to the photoresist layer and to the semiconductor layer located beneath it.

The positive photoresists that are preferentially used in the lithography methods typically include a light-sensitive component (sensitizer), which together with a matrix material is dissolved in a solvent. A phenol resin is typically used as the matrix material; once the solvent has evaporated, it lends the resist layer high resistance to lyes. As a consequence of a photochemical reaction, when the resist is exposed to light from a strong UV source, an acid is formed. The acid-containing regions formed in this way, at the points of the photoresist layer that are exposed to light, exhibit high solubility in alkaline solutions and can then be easily removed with the aid of a lye. As a result, the structure of the photoexposure mask is copied to the photoresist layer.

The photoresist layer thus structured is then used as a mask for processing the semiconductor layer located beneath.

If the desired structural widths are to be maintained in structuring the semiconductor layer, an important factor is that the transfer of the original structure exposed to light be copied onto the photoresist layer in a way that is as close to the original as possible. Fluctuations in width can in fact have fatal consequences for the functioning of the structures. Besides the optical problems typically involved in transferring the original mask structure to the photoresist layer, such as light scattering, interference, and so forth, it is above all the composition of the foundation located beneath the photoresist layer that can adversely affect the structuring property of the photoresist layer, and thus the adherence to the intended structural widths.

In particular, a foundation layer deposited by a plasma enhanced chemical vapor deposition (PECVD) method onto the substrate surface often has components of foreign material, such as nitrogen or amino and other nitrogen compounds in its regions near the surface. It is predominantly the undefined conditions at the end of the PECVD process that are responsible for the incorporation of the foreign material, and the conditions are the result of slight deviations when the plasma source or gas supply is switched off. A further portion of the foreign material often stems from the incorporation of contaminants, which are always present in slight quantities inside the process chamber.

From interactions of the foreign material with the components of the photoresist layer, the chemical and physical properties of the photoresist layer can be changed to such an extent that the photolithographic process is impeded in the regions of the photoresist layer effected by the diffusion. Especially the acid, formed in the resist upon exposure to light, at the boundary face with the foundation layer can be neutralized by the alkaline nature of the foreign material in the foundation layer, making the neutral regions of the photoresist layer harder to dissolve in the lye bath, so that in the ensuing wet-chemical process, they cannot be removed completely. The photoresist residues, which consequently remain on the foundation layer underneath, constrict the opening region inside the photoresist layer (resist footing) for the stack of layers beneath it.

The different conditions of various CVD process chambers can also lead to unreplicable results in producing semiconductor structures. If the fluctuations in structural widths of various "production passes" vary too greatly, the affected process steps must be repeated, which in turn makes the production costs substantially higher.

U.S. Pat. No. 6,174,816 to Yin et al. describes a method for reducing resist residues (degradations), which occur in photolithographic structuring and in which an antireflection coating (ARC) is formed under a photolithography layer. Such ARC coatings serve to reduce light scattering when a photoresist layer is exposed to light.

In the method disclosed in Yin et al., the ARC coating (after the deposition process) is subjected to an additional process step. In it, the ARC coating is exposed to a plasma or a liquid reagent, as a result of which residues which occur in photolithographic structuring of the photoresist layer, deposited in the further course of the process onto the ARC coating, are reduced.

SUMMARY OF THE INVENTION

It is accordingly an object of the invention to provide a method for producing a structured layer on a semiconductor substrate that overcomes the hereinafore-mentioned disadvantages of the heretofore-known methods of this general type and with which a reduction in resist residues (degradations) can be achieved.

Accordingly, in the method of the invention, the surface of a foundation layer to be structured is modified on a semiconductor substrate such that the alkaline substances within the regions near the surface of the foundation layer are neutralized. Consequently, the foundation layer is closed off in a defined way, which prevents the reaction with a photoresist layer formed over the foundation layer.

As a result of the surface modification according to the invention, the deviations in structural width in the structured foundation layer that occur in conventional photoresist structuring processes can be reduced substantially. Moreover, the structural width fluctuations caused by the different conditions of various process chambers can also be reduced markedly.

In one embodiment of the invention, the foundation layer is modified preferably with the aid of a reactive atmosphere, which has a high proportion of oxygen. As a result, the foundation layer can be sealed in a defined manner in an especially simple and effective way.

In another embodiment of the invention, the foundation layer is deposited onto a substrate surface with the aid of a PECVD method. In the final phase of the deposition process, the oxygen content in the reactive atmosphere is increased. As a result, the deposited foundation layer is modified in situ. Consequently, the deposition and modification processes are combined into one process step, which substantially simplifies the course of the process.

In a further embodiment of the invention, the oxygen partial pressure of the reactive atmosphere is increased by reducing the inflow of at least one oxygen-poor gas component. As a result, the transition between the deposition and the modification can be achieved in a simple way.

In yet another embodiment of the invention, the oxygen partial pressure of the reactive atmosphere is increased by increasing the inflow of at least one oxygen-rich gas component. As a result, the buildup of the region near the surface of the layer is performed under conditions of oxygen excess, and thus the surface of the layer is closed off in a defined way still during the deposition.

With the foregoing and other objects in view, there is provided, in accordance with the invention, a method for producing a structured layer on a semiconductor substrate. The method includes the steps of creating the layer on the substrate, modifying a surface of the layer to form a chemically neutral surface, creating an acid-forming photoresist layer on the layer on the substrate, exposing the acid-forming photoresist layer to light for embodying an acid-containing layer in the photoresist layer in accordance with a specified structure of a photoexposure mask, and selectively removing the acid-containing region of the photoresist layer with a lye.

In accordance with another mode of the invention, the method also includes the step of modifying the surface of the layer on the substrate with an oxygen-rich plasma for obtaining a chemically neutral surface.

In accordance with a further mode of the invention, the method also includes the step of exposing the surface of the layer on the substrate to the oxygen-rich plasma for up to 60 seconds.

In accordance with an added mode of the invention, the layer on the substrate is an insulator layer.

In accordance with an additional mode of the invention, the insulator layer includes one of silicon oxide, silicon oxynitride, and silicon nitride.

In accordance with yet another mode of the invention, the method further includes the step of creating the layer on the substrate with a plasma-reinforced gas phase deposition process.

In accordance with yet a further mode of the invention, the method also includes the step of increasing a partial pressure of oxygen in the plasma, in a final phase of the plasma-reinforced gas phase deposition process, so that the surface of the layer is closed off in a defined way.

In accordance with yet an added mode of the invention, the plasma-reinforced gas phase deposition process has at least one gas component containing oxygen, and wherein oxygen excess in the plasma is formed by reducing an inflow of at least one gas component not containing oxygen.

In accordance with yet an additional mode of the invention, the oxygen excess in the plasma is formed by increasing the inflow of at least one gas component that contains oxygen.

In accordance with again another mode of the invention, the oxygen excess in the plasma is formed by supplying another oxygen-containing gas.

In accordance with again a further mode of the invention, performing the step of modifying the surface of the layer to form the chemically neutral surface, in the final phase of the plasma reinforced gas phase deposition process, by adapting at least one of a substrate temperature, a pressure within a process chamber and a parameter of the plasma.

Other features which are considered as characteristic for the invention are set forth in the appended claims.

Although the invention is illustrated and described herein as embodied in a method for producing a structured layer on a semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a block diagram of a PECVD process chamber for a process according to the invention for depositing and modifying a foundation layer for a photoresist layer.

DESCRIPTION OF THE PREFERRED EMBODIMENTS

Figure 1A:
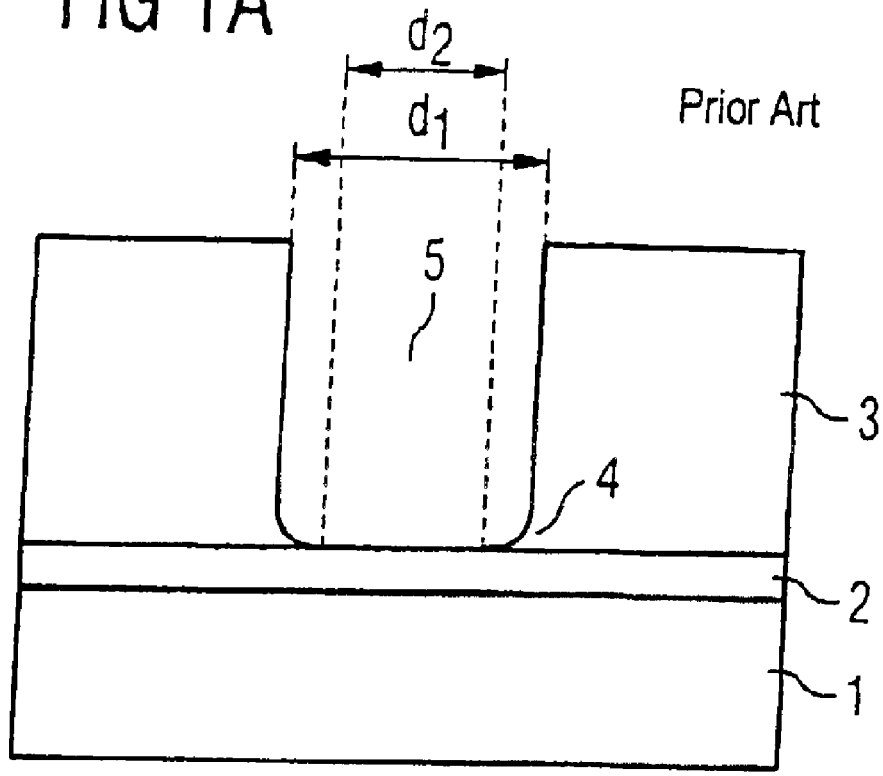
FIG. 1A is a diagrammatic, cross sectional view of a semiconductor substrate, with a stack of layers embodied on the substrate, having an opening region produced by a conventional method.

Referring now to the figures of the drawings in detail and first, particularly to FIG. 1A thereof, there is shown a stack of layers produced on a semiconductor substrate 1 by a conventional method. The stack includes a first layer 2, which will hereinafter be called the "foundation layer", and an acid-forming photoresist layer 3 applied over the foundation layer 2. An acid-forming photoresist layer 3 has an opening region 5, which is formed by a photolithographic method and penetrates the entire acid-forming photoresist layer 3; in its upper and middle regions, the opening region 5 has steep flanks, with a diameter d1, while in its lower region it has a constriction with a diameter d2. The constriction is the result of residues (degradations) 4 of the acid-forming photoresist layer 3, which, because of diffusion processes, are contaminated with alkaline components of the foundation layer 2. The acid produced inside the acid-forming photoresist layer 3 upon exposure to light is neutralized inside the alkali-contaminated regions of the photoresist layer 3, so that the neutral regions of the photoresist layer 3 are insoluble for an ensuing etching process using a lye. The contaminated regions therefore remain on the foundation layer 2 after the etching process and form the resist degradations 4 of the photoresist layer 3 (resist footing) that narrow the opening region 5.

The degradations 4 of the photoresist layer 3 change the cross section of the opening region 5 for the ensuing processes. In particular, the opening region 5 in the photoresist layer 3 is reduced in size for the further structuring of the foundation layer 2 or substrate 1. This results in deviations from the desired width of the structures with the foundation layer 2 or substrate 1.

Figure 1B:
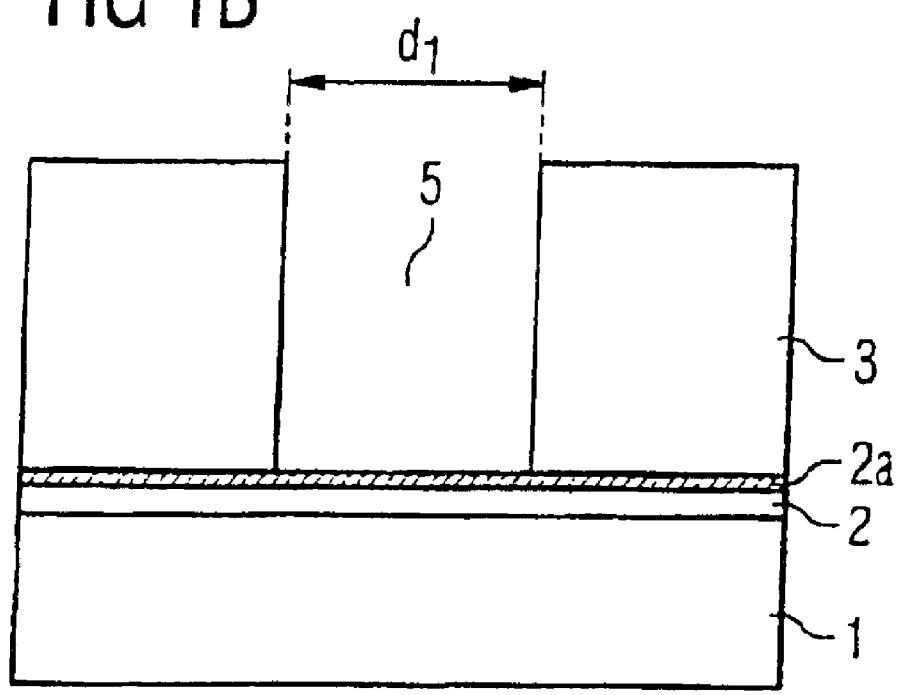
FIG. 1B, is a cross sectional view of the semiconductor substrate, with a stack of layers embodied on the substrate, having an opening region produced by a method according to the invention.

In accordance with the invention, FIG. 1B shows a stack of layers, analogous to FIG. 1A, on the semiconductor substrate 1, with a foundation layer 2 disposed over the semiconductor substrate 1 and with the acid-forming photoresist layer 3 embodied over the foundation layer 2. The foundation layer 2, however, has a thin, chemically neutral region 2a on its surface, and the region is formed as a result of a modification of the near-surface regions in the foundation layer 2 that is performed immediately after the deposition of the foundation layer 2.

As a result, the foundation layer 2 is closed off in a defined way, and the diffusion of alkaline components out of the foundation layer 2 into the acid-forming photoresist layer 3 is thus prevented. Because of the homogeneity of the acid-forming layer 3, an acid is released from all regions of the acid-forming photoresist layer 3 that are subjected to a lithographic exposure to light; thus, the regions of the photoresist layer 3 that are exposed to light are removed completely in a lye bath. As shown in FIG. 1B, the opening region 5 embodied inside the acid-forming photoresist layer 3 has a constant diameter d1 all the way down to the foundation layer 2.

The method of the invention for producing a structured layer on a semiconductor substrate will now be described in conjunction with FIGS. 2A-2F.

Figure 2A:
FIGS. 2A-2F are cross sectional views of the semiconductor substrate after various process steps for producing the semiconductor structure of FIG. 1B.

FIG. 2A shows a cross section through the semiconductor substrate 1 at the beginning of the method of the invention.

In a first process step, the first layer 2 is formed on the substrate 1, preferably with the aid of a plasma-reinforced gas phase deposition method (PECVD).

Figure 2B:
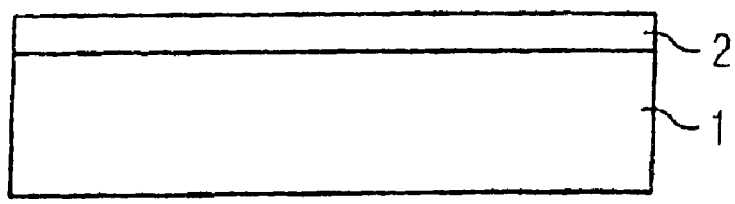

The first layer 2 preferably contains an insulator containing silicon, such as silicon oxide (SiO), silicon oxynitride (SiON) and silicon nitride (SiN), and preferably serves to insulate the substrate from layer structures formed in further processes (not described in detail herein). Since, in the ensuing structuring process, the photoresist layer 3 is deposited directly onto the first layer 2, the first layer 2 will hereinafter be called the "foundation layer". FIG. 2B shows the foundation layer 2 embodied thinly over the substrate 1.

In a PECVD method, the layer material is (as a rule) deposited, via complex precursor systems, from a reactive gas phase on the surface of the substrate 1. Fluctuations in the course of the PECVD method, which can occur for instance during the process of switching off the supply of gas or the plasma source in the final stage of the PECVD method, result in an undesired course of the plasma reaction with the surface of the deposited foundation layer 2. This can markedly affect the properties of the foundation layer 2; among other results, undesired reaction products may be incorporated into the foundation layer 2.

The reaction products, especially nitrogen, amino compounds and other nitrogen compounds, act as contaminants and, by diffusion into the acid-forming photoresist layer 3 formed later over the foundation layer 2, they can adversely affect the chemical and physical properties of the acid-forming photoresist 3.

Figure 2C:
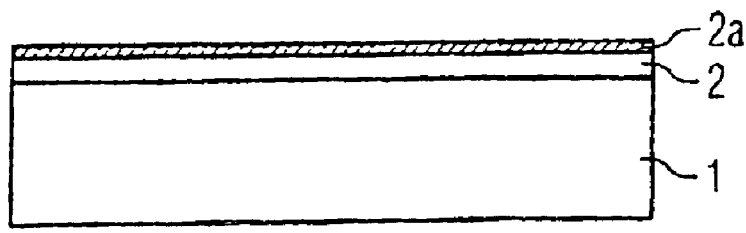

To avoid the negative effects, in a second partial step of the PECVD process, the foundation layer 2 is closed off in a defined way, as shown in FIG. 2C. The surface of the foundation layer 2 is exposed, preferably for 1 to 60 seconds, to an oxygen-containing plasma 25. The plasma process preferably runs under the following process conditions:

| | |
|---|---|
| wafer temperature: | 300 to 550 degrees C.; |
| pressure: | 0.5 to 20 Torr |
| gas flow rate: | 10 to 10,000 sccm |
| electrode spacing HC: | 10 to 100 mm |
| RF power: | 100 to 1,000 W |
| RF frequency: | approximately 13.56 MHz. |

Advantageously, the process step is performed immediately after the deposition of the foundation layer 2; the reactive oxygen-rich atmosphere 25 is formed by suitable adaptation of the parameters of the PECVD process. Preferably, the partial pressure of the oxygen-rich gas component is increased by controlling the supply of the gas components. To that end, with the aid of meterable gas valves (as shown in FIG. 3 with reference numerals 27a and 27b), the supply of oxygen-rich gas components is increased, and/or the supply of oxygen-poor gas components is throttled. Alternatively, a further oxygen-containing gas can also be supplied to the plasma atmosphere.

The modification of the surface of the foundation layer 2 can, however, also be attained by adapting other process parameters, in particular the substrate temperature, the RF power and/or the RF frequency, the pressure, and the spacing of plate electrodes (as shown in FIG. 3 at reference numerals 14 and 15). The PECVD process is modified in favor of the reaction of the oxygen-rich plasma components, or in favor of the reaction of the oxygen-poor plasma components, having the surface of the foundation layer 2 deposited.

Then, the modified foundation layer 2 (as shown in FIG. 2C) has a near-surface region 2a, which is free of nitrogen compounds that are capable of diffusion.

Figure 2D:
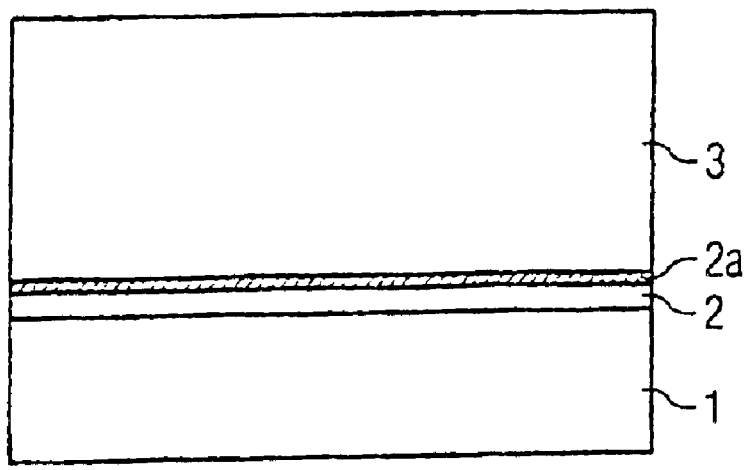

As FIG. 2D shows (in an ensuing process step) the acid-forming photoresist layer 3 is formed on the foundation layer 2. The photoresist layer 3 preferably contains a positive photoresist, in which only regions 5a exposed to light are removed in an etching process. By the modification (performed in the preceding process step) of the surface of the foundation layer 2, the diffusion of the nitrogen, amino compounds and/or other nitrogen compounds into the photoresist layer 3 is prevented, so that the photoresist layer 3 (in the region of contact with the foundation layer. 2) has no alkaline contamination.

Figure 2E:
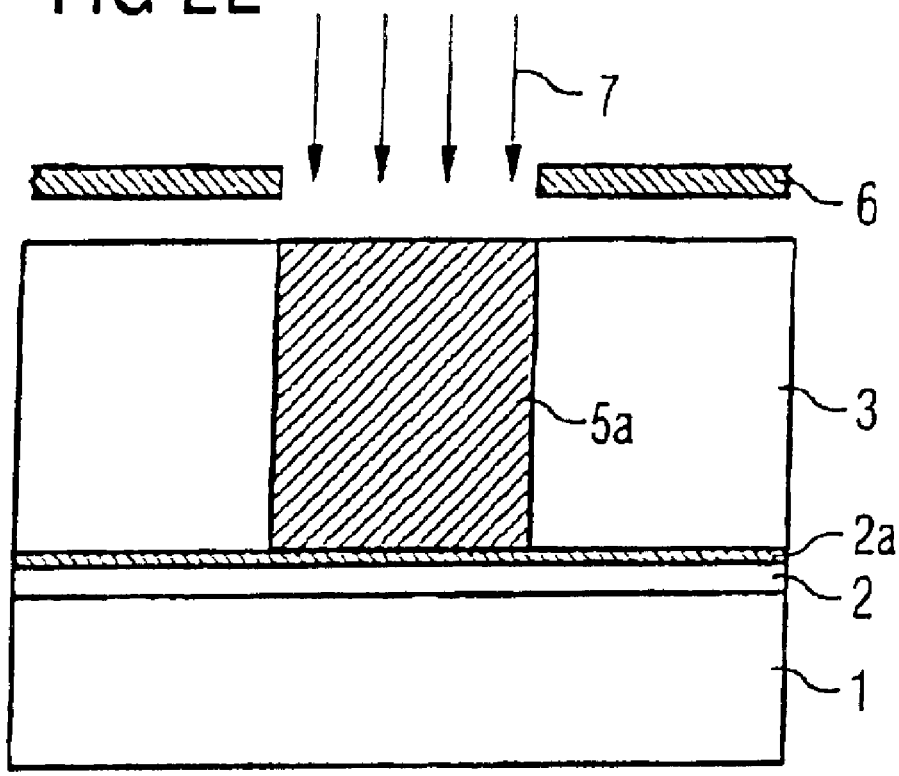

In another ensuing process step, the opening region 5 is formed inside the photoresist layer 3. The photoresist layer 3 is irradiated through a photoexposure mask 6 with the aid of visible-light, electronic, or X-radiation 7. The regions 5a of the photoresist layer 3 that are located in the region of the mask through which radiation passes are exposed to light all the way down to the foundation layer 2 (as shown in FIG. 2E). As a consequence of a photochemical reaction, an acid is formed when the photoresist 3 is exposed to light. The acid-containing regions 5a, formed in this way, in the photoresist layer 3 have high solubility in alkaline solutions.

Figure 2F:
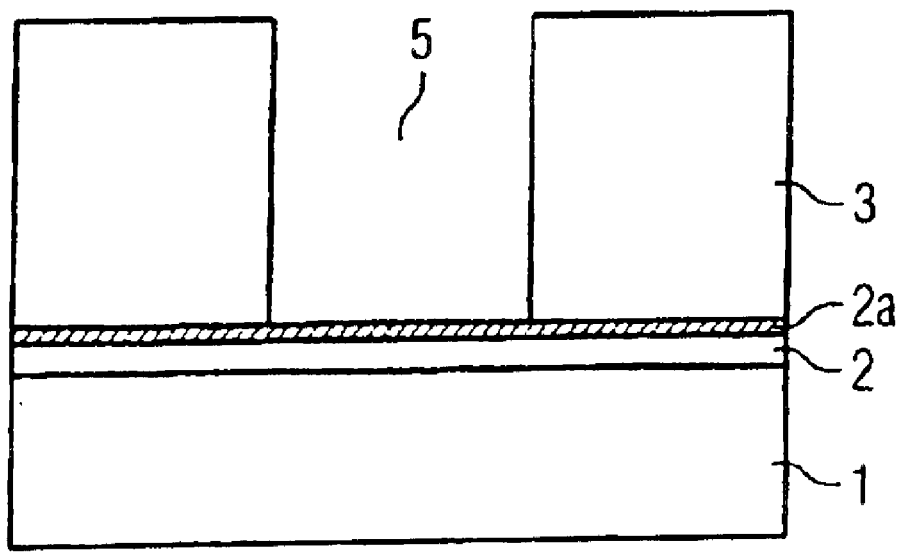

After the photoresist layer 3 is developed and hardened, the acid-containing regions 5a of the photoresist layer 3 are selectively removed down to the foundation layer 2 by a wet-chemical method. The opening region 5 formed has a steep-flanked course (as shown in FIG. 2F). In contrast to the opening region 5 produced by the conventional method, the structured photoresist layer 3 has no residues 4 remaining in the opening region 5.

Alternatively, the method of the invention can also be employed for structuring an acid-forming negative photoresist layer, in which the regions of the photoresist that are not exposed to light are removed by a wet-chemical process.

FIG. 3 shows a process chamber 10 for performing the process of deposition and modification, shown in FIGS. 2A through 2C, of the foundation layer 2 and of the photoresist layer 3.

The process chamber 10 is embodied as a parallel plate reactor, in which the gases flowing into the process chamber 10 are excited and decomposed by a high-frequency gas discharge 25 between two electrodes 14, 15 embodied as plates. The resultant reactive decomposition products can then react, via complex mechanisms, with the substrate surface.

A carrier 15, on which a semiconductor wafer 1 (wafer) rests, is embodied in the lower region of the process chamber 10. The carrier 15 contains a heating element 11 for controlling the temperature of the wafer 1. By increasing the temperature, the reaction parameters of the gases with the surface of the wafer 1 can be optimized.

In the upper region of the process chamber 10, a special gas inlet system (showerhead) 14 is embodied, through which the reaction gases are carried into the process chamber 10. The showerhead 14 serves to make the gas supply in the region of the wafer 1 homogeneous, and contains a gas inlet opening 20, a gas chamber 21, and a special gas outlet 24.

The gas inlet opening 20 serves to introduce the reaction gases into the showerhead 14. A gas supply system is connected to the gas inlet opening 20. The gas supply system contains two gas sources 29a, 29b and two meterable gas valves 27a, 27b (as shown in FIG. 3). The gas inlet opening 20 of the process chamber 10 connects with the gas sources 29a, 29b via gas lines 28, and the meterable gas valves 27a, 27b are switched between the gas inlet opening 20 and the gas sources 29a, 29b in order to control the gas inflows. The composition of the gas mixture introduced into the process chamber 10 can be determined precisely with the aid of the two meterable gas valves 27a, 27b.

The upper region of FIG. 3 shows in detail the gas outlet 24 of the showerhead 14. The gas outlet 24 is formed by many small openings 24, which are embodied inside a thin bottom plate 23 of the showerhead 14. The openings 24 preferably have a mutual spacing of about 6 mm and a diameter of about 0.6 mm.

To create a reactive plasma 25, the gases flowing into the process chamber 10 are subjected to a high-frequency alternating field (approximately 13.56 MHz), which is generated by an RF generator 26 disposed outside the process chamber 10. The carrier 15 and the showerhead 14 serve as plate electrodes of the RF generator 26 and are each connected to one pole of the RF generator 26.

Due to the high RF power (100 to 1,000 W) and the slight spacing HC of the plate electrodes 14, 15 (approximately 10 to 100 mm), such a strong alternating field is generated in the space between the carrier 15 and the showerhead 14 that a gas discharge is ignited within the inflowing gas. By impact processes, ions, radicals and free electrons are formed, which interact with one another and with the surface of the wafer 1.

A heat sink 13 secured to the process chamber 10 serves to cool the showerhead 14. In its upper region, the heat sink 13 has an inlet connection and an outlet connection 12a, 12b, respectively, for a coolant medium. The heat sink 13 preferably contains an insulator, which simultaneously insulates the showerhead electrically from the process chamber 10.

In the lower region of the process chamber 10, two gas suction nozzles 22 are formed by which the reaction products of the plasma process are pumped out. To assure a vacuum of approximately 0.5 to 15 Torr, which is required for the plasma process, inside the process chamber 10, the gas suction nozzles 22 preferably connect directly with powerful vacuum pumps and have a relatively large diameter compared to the gas inlet opening 20. With the aid of a non-illustrated throttle valve, which is located between the gas suction nozzles 22 and the vacuum pumps and which varies the effective diameter of the suction conduit between the gas suction nozzles 22 and the vacuum pumps, the gas pressure inside the process chamber 10 can be adjusted precisely.

The process chamber 10 shown in FIG. 3 serves to create layers with the aid of the PECVD method. The growth of layers is attained by the reactions of the reactive gas components, formed in the plasma 25, with the surface of the substrate 1. The deposition process takes place by complex precursor systems and reacts sensitively to changes in the process parameters within the process chamber 10. Via targeted adaptation of the parameters, the PECVD process, in its final portion, can be controlled such that the surface of the deposited layer 2 is modified. To that end (preferably, as shown in the embodiment of FIGS. 2A-2F), the composition of the plasma 25 can be changed by varying the reaction gases supplied, in favor of the oxygen. The layer 2 previously formed on the substrate 1 is thus closed off in a defined way by oxide.

The characteristics of the invention disclosed in the above description, recited in the claims and shown in the drawings, can be essential both individually and in arbitrary combination for realizing the invention in its various embodiments.

I claim:

1. A method for producing a structured layer on a semiconductor substrate, comprising the steps of:

forming the layer on the substrate with a plasma-reinforced gas phase deposition process in a first partial step of plasma-reinforced gas phase deposition process and modifying a surface of the layer to form a chemically neutral surface in a second partial step of the plasma-reinforced gas phase diposition process;

forming an acid-forming photoresist layer on the layer on the substrate;

exposing the acid-forming photoresist layer to light for embodying an acid-containing layer in the photoresist layer in accordance with a specified structure of a photoexposure mask; and selectively removing the acid-containing region of the photoresist layer with a lye.

2. The method according to claim 1, which further comprises the step of modifying the surface of the layer on the substrate with an oxygen-rich plasma for obtaining a chemically neutral surface.

3. The method according to claim 2, which further comprises the step of exposing the surface of the layer on the substrate to the oxygen-rich plasma for up to 60 seconds.

4. The method according to claim 1, wherein the layer on the substrate is an insulator layer.

5. The method according to claim 4, wherein the insulator layer includes one of silicon oxide, silicon oxynitride, and silicon nitride.

6. The method according to claim 1, which further comprises the step of increasing a partial pressure of oxygen in the plasma, in a final phase of the plasma-reinforced gas phase deposition process, so that the surface of the layer is closed off in a defined way.

7. The method according to claim 6, wherein the plasma-reinforced gas phase deposition process includes at least one gas component containing oxygen, and wherein oxygen excess in the plasma is formed by reducing an inflow of at least one gas component not containing Oxygen.

8. The method according to claim 7, wherein the oxygen excess in the plasma is formed by increasing the inflow of at least one gas component containing oxygen.

9. The method according to claim 7, wherein the oxygen excess in the plasma is formed by supplying another oxygen-containing gas.

10. The method according to claim 8, which further comprises performing the step of modifying the surface of the layer to form the chemically neutral surface, in the final phase of the plasma reinforced gas phase deposition process, by adapting at least one of a substrate temperature, a pressure within a process chamber and a parameter of the plasma.

* * * * *